CONTROLLABLE TUNNEL DIODE

Filed Dec. 16, 1966

INVENTOR
Reinhard Dahlberg

BY Spencer & Kaye

ATTORNEYS

United States Patent Office 3,460,008

Patented Aug. 5, 1969

3,460,008

CONTROLLABLE TUNNEL DIODE

Reinhard Dahlberg, Heilbronn-Bockingen, Germany, assignor to Telefunken Patentverwertungsgesellschaft m.b.H., Ulm (Danube), Germany Filed Dec. 16, 1966, Ser. No. 602,407
Claims priority, application Germany, Dec. 27, 1965, T 30,130
Int. Cl. H01l *11/02;* H03k *19/08, 23/08*
U.S. Cl. 317—235 18 Claims

ABSTRACT OF THE DISCLOSURE

A controllable tunnel diode in the form of a combined tunnel diode and Peltier element, wherein one semiconductor zone of the tunnel diode also forms one leg of the Peltier element, the second leg of the Peltier element being constituted by two contacts which are in non-rectifying contact with the semiconductor zone which is common to the tunnel diode and the Peltier element. As a result, when a voltage is applied across the two contacts, one of the contacts will, due to the Peltier effect, inject into and through the common semiconductor zone those electrons which are not in thermal equilibrium with their surroundings thereby to modulate the current flowing through the tunnel diode.

BACKGROUND OF THE INVENTION

Tunnel diodes make use of the mechanical wave phenomenon, this being the so-called tunnel effect or tunnelling process. According to this tunnel effect, an electron wave of low energy can pass through potential swells of higher energy when the potential peak is sufficiently low. In this case of tunnel diodes, this condition is met by heavily doping the semiconductor body on both sides of the boundary layer with impurity atoms. In this way, the space charge zone between the $n^+$ and the $p^+$ region becomes very thin. Moreover, the valence band limit of the one layer is raised to or above the energy level of the conductivity band limit of the other layer. In this way, a large number of charge carriers can tunnel from the conductivity band of the one zone into the valence band of the other, or vice versa, and thereby contribute to the current flowing through the diode.

If the impurity concentration is so high that the material is doped to degeneracy, and if an initially low forward voltage is applied to the tunnel diode, the large number of the charge carriers which are made available by the heavy doping of the semiconductor zones are removed. This means that, with increasing forward voltage, the current flowing through the tunnel diode at first increases very rapidly to a maximum, this being the so-called peak voltage. Upon further increase of the forward voltage, it becomes more difficult for the charge carriers to tunnel through the potential peak between the valence band and the conductivity band, and the current decreases and drops to a minimum, this being the so-called valley point of the voltage curve. This falling characteristic represents a negative resistance of the diode. From this voltage valley, the forward diode current increases exponentially with increasing voltage, due to the normal diffusion and recombination processes.

Summary of the invention

Based on the above-described tunnel effect, there is provided, in accordance with the present invention, a controllable tunnel diode which is a combination of a tunnel diode and a Peltier element, wherein one semiconductor zone of the tunnel diode simultaneously serves as one portion or leg of the Peltier element, while the second leg of the Peltier element consists of two non-rectifying contacts on the semiconductor zone, so that when a voltage is applied across these two non-rectifying contacts, one of them will, due to the Peltier effect, inject into and through the semiconductor zone of the tunnel diode those electrons which are not in thermal equilibrium with the surroundings, these electrons modulating the current flowing through the tunnel diode.

Thus, in accordance with the present invention, the Peltier effect, that is to say, the inverse thermoelectric effect, is utilized for controlling the forward current of a tunnel diode. According to the Peltier effect, when two thermoelectrically similar legs are on a third, thermoelectrically dissimilar leg, and when a voltage is applied across the two thermoelectrically similar legs, one of the junctions of the thermoelectric zones is cooled while the other junction is heated up. The junction which is cooled is that junction at which an electron current flows from the thermoelectrically positive to the thermoelectrically negative material. If the current flows in the opposite direction, the same junction will be heated. This effect is readily understandable, considering the fact that electrons can flow out of a material which has a positive contact voltage with respect to a second material into this second material only by doing work. This work is taken out of the crystal grating in the form of thermal energy so that the site of the junction is cooled. If, on the other hand, an electron current flows in the opposite direction, energy is given off and the electrons accelerate. These electrons soon give up their energy by colliding with the lattice, which means that the junction is heated up. Thus, so-called "hot electrons" emanate from the hot junction, and these electrons can, under certain conditions, be injected into the diode. If the path which the "hot electrons" have to travel to the pn-junction of the diode is short, the probability that they will reach as far as the potential peak at the pn-junction is relatively great. In this way, then, it is possible to control and modulate the current through a tunnel diode by means of the hot electrons. It is, in particular, the voltage in the voltage range down to the valley point voltage which can be controlled in this way.

In order for the Peltier element to operate with as high an efficiency as possible, the voltage applied to the two thermoelectrically similar legs of the thermoelement should not exceed a predetermined value. Here it should be noted that the usable cold and heat output of a Peltier element is reduced by two unavoidable effects. Assuming the electrical resistance of the circuit to be R, a current I will, according to Joule's law, produce an amount of heat equal to $I^2R$, half of which flows to each of the two junctions, i.e., half will flow to the hot junction and half to the cold junction. Furthermore, there will be a heat flow from the hot to the cold junction. These two effects tend to equalize the temperature difference between the two junctions. Differentiating the equation which, on the basis of these effects, characterizes the behavior of the Peltier element, it will be seen that the maximum temperature difference between the two junctions is obtained when a voltage equal to the Peltier voltage is applied across the two contacts. The Peltier voltage, which is sometimes referred to in the technical literature as the Peltier coefficient, is the product of the thermoelectric force (this being the voltage which appears across a thermoelectric element when the temperature difference at the junctions is one degree) multiplied by the absolute temperature, in degrees Kelvin, at which the Peltier element is operated. If the voltage applied to the Peltier element is equal to twice the Peltier voltage, the temperature difference at the two junctions becomes zero, since the Peltier effect is now completely canceled out by the Joulean heat. Thus, in a tunnel diode which is controlled in accordance with the present invention, the voltage applied across the two thermoelectrically similar legs of the Peltier element is equal to the Peltier voltage since the current which will then flow will be the optimal current, that is to say, the current at which the temperature difference and hence the efficiency of the Peltier element will be the greatest.

Description of the preferred embodiments

Figure 1:
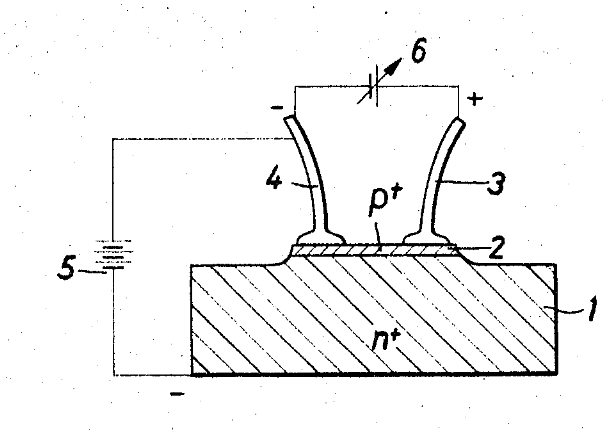
FIGURE 1 is a sectional view of a controllable mesa tunnel diode according to the present invention, FIGURE 1 also showing the electrical voltage applied to the diode.

Referring now to the drawing and first to FIGURE 1 thereof, the same shows a tunnel diode having two semiconductor zones 1 and 2, both of which are doped to degeneracy. The slab forming the zone 1 is $n^+$-doped, the zone 2, which is in the form of a layer, is heavily $p^+$-doped with elements from the III-group of the periodic system. The thus-doped tunnel diode, shown as having a mesa structure, has the characteristic illustrated in FIGURE 2. At first, the current increases with increasing voltage to a maximum $I_{max}$, which occurs at the voltage peak $V_p$; from that point on, if the voltage is increased, the current decreases until it is $I_{min}$, this occurring at the point where the voltage is at the valley point $V_V$. From there, the current again increases with increasing voltage.

Referring once more to FIGURE 1, the $p^+$-doped layer 2 carries two contacts 3 and 4 which consist of a material which is thermoelectrically negative, that is to say, N-conductive, with respect to the $p^+$-semiconductor layer 2. If, then, there is applied a voltage 6 across the two contacts, which voltage is, for example, equal to and generally no greater than twice the Peltier voltage, the junction at which an electron current flows from the N-conductive leg of the Peltier element to the P-conductive leg will be heated up. From this hot junction, at which the electrons have a high thermal energy imparted to them, "hot electrons" are injected into the thermoelectrically P-conductive $p^+$-layer 2 of the diode. If the $p^+$-layer 2 is sufficiently thin, the thermal energy of the injected charge carriers will suffice to reach to the pn-junction, where they are absorbed by the potential drop which exists at that point. In practice, the thickness of the $p^+$-layer should be less than $1\mu$, and can be made by epitaxial, diffusion or alloying processes. For example, impurity atoms may be diffused into the entire surface of a semiconductor slab, after which part of the $p^+$-layer is etched away so as to give the element the mesa structure shown in FIGURE 1.

The contacts 3 and 4 may consist, for example, of gold and can be applied to the $p^+$-layer of the tunnel diode by thermal compression.

The control voltage 6 can be a D.C. voltage or an A.C. voltage.

The diode current is best controlled so as to be in that region of the characteristic in which the forward voltage of the tunnel diode is less than the valley point voltage. Thus, the forward voltage applied to the diode will normally have values down to the valley point voltage.

When that portion of the injected current which reaches the $n^+$-region of the tunnel diode, multiplied by the voltage 5 across the diode, is greater than the total injected current multiplied by the voltage across the contacts 3 and 4 of the Peltier element, the arrangement is a so-called active element.

Figure 3:
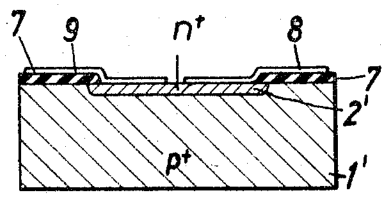
FIGURE 3 is a sectional view of a controllable planar tunnel diode according to the present invention.

FIGURE 3 shows a planar element according to the present invention, whose thermoelectric contacts are formed by the vapor deposition of conductive strips. First, a $p^+$-doped semiconductor slab 1' is provided with an insulating layer, such as an oxide coating, the same being provided with a window through which the $n^+$-zone 2' is diffused into the slab 1'. After this diffusion, the surface of the semiconductor is again coated with an insulating layer 7, as is well known in the art, this layer 7 being provided with a window to allow the thermoelectric contacts 8 and 9 to be applied. The two thermoelectric contacts are in the form of P-conductive strips, made, for example, of aluminum, gold or a suitable semiconductor material, and vapor deposited so as to form together with the $n^+$-layer of the tunnel diode a Peltier element and so as to terminate on the insulating layer 7, as a result of which there is available a relatively large area for contacting these contacts and to allow the necessary operating voltages to be applied to the diode.

The elements described above are particularly suited for use in microwave circuitry; they can, moreover, be used in integrated circuits for any of many other different applications.

It will be understood that the above description of the present invention is susceptible to various modifications, changes, and adaptations.

The following are illustrative examples of the present invention.

EXAMPLE 1

In a mesa tunnel diode as shown in FIGURE 1, the semiconductor slab is made of germanium and is As doped, the layer which is common to the tunnel diode and the Peltier element being made of germanium and Ga doped, the thickness of this layer being $0.05\mu$. The contacts are made of aluminum. The diode voltage is .5 v. and the voltage applied to the contacts of the Peltier element is .1 v. D.C.

EXAMPLE 2

Figure 2:
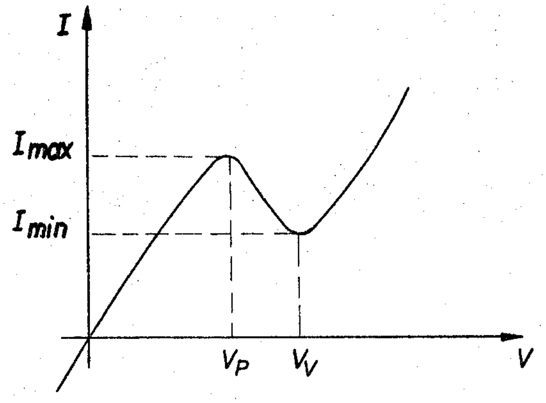
FIGURE 2 is a graph showing the characteristic of the diode of FIGURE 1.

In a planar tunnel diode as shown in FIGURE 2, the semiconductor slab is made of GaAs and is Zn doped, the layer 2 which is common to the tunnel diode and the Peltier element being formed by diffusing Sn atoms into the slab with the thickness of layer 2 being approximately $.1\mu$. The insulating layer 7 is mode of $Si_3N_4$ and is $.2\mu$ thick. The contacts 8 and 9 are made of gold. The diode voltage is 1 v. and the voltage applied across the contacts 8 and 9 is .2 v. A.C.

I claim:

1. A combined tunnel diode and Peltier element, comprising, in combination: two semiconductor zones between which there is a pn-junction, said two zones constituting the tunnel diode, one of said zones also being one leg of the Peltier element and thus being a zone which is common to both said tunnel diode and said Peltier element, the second leg of said Peltier element being constituted by two contacts which are in non-rectifying contact with said common zone, said common zone being sufficiently thin to enable one of said contacts, when a voltage is applied across said two contacts, to inject, due to Peltier effect, those electrons which are not in thermal equilibrium with their surroundings through said common zone and said pn-junction into the other zone of said tunnel diode, thereby to modulate the current flowing through said tunnel diode.

2. The combination defined in claim 1 wherein said tunnel diode has a $n^+p^+$ sequence af layers, said $n^+$-doped layer being said common semiconductor zone and, together with said two contacts, constituting said Peltier element.

3. The combination defined in claim 2 wherein said contacts are thermoelectrically positive with respect to said common semiconductor zone.

4. The combination as defined in claim 1 wherein said tunnel diode has a $n^+p^+$ sequence of layers, said $p^+$-doped layer being said common semiconductor zone and, together with said two contacts, constituting said Peltier element.

5. The combination defined in claim 4 wherein said contacts are thermoelectrically negative with respect to said common semiconductor zone.

6. The combination defined in claim 1 wherein said tunnel diode is planar and said common semiconductor zone has a thickness of less than 1$\mu$.

7. The combination defined in claim 1 wherein said common semiconductor zone is a zone which has been diffused into a semiconductor body.

8. The combination defined in claim 1 wherein said common semiconductor zone is a zone which has been epitaxially applied into a semiconductor body, said common zone having a thickness of less than 1$\mu$.

9. The combination defined in claim 1 wherein said tunnel diode has a mesa.

10. The combination defined in claim 1 wherein said contacts are contacts which have been thermocompressed onto said common semiconductor zone.

11. The combination defined in claim 1 wherein said contacts are conductive strips that are strips that have been vapor deposited on an insulating layer which is on the surface of said tunnel diode.

12. The combination defined in claim 11 wherein said contacts consist of gold and are contacts that have been thermocompressed onto said insulating layer.

13. The combination defined in claim 11 wherein said strips consist of a material selected from the group consisting of aluminum or gold.

14. The combination defined in claim 1, further comprising means for applying across said contacts a D.C. or A.C. voltage which is no greater than twice the Peltier voltage at the operating temperature of said Peltier element.

15. The combination defined in claim 1, further comprising means for applying a voltage to said tunnel diode for driving the same in forward direction, and means for applying a control voltage across said contacts of said Peltier element.

16. The combination defined in claim 1, further comprising means for applying to said tunnel diode a forward voltage which is less than the valley point voltage of said tunnel diode, in consequence of which the thermal electrons injected by said Peltier element into said diode modulate the forward current of said diode.

17. The combination defined in claim 1 wherein both of said contacts consist of semiconductor material.

18. For use in microwave circuits or integrated circuits, the combination defined in claim 1.

References Cited

UNITED STATES PATENTS

| | | | |
|---|---|---|---|
| 2,896,005 | 7/1959 | Fritts et al. | 317—235 |
| 2,936,425 | 5/1960 | Shockley | 317—235 |
| 3,254,278 | 5/1966 | Kaye | 317—235 |

JOHN W. HUCKERT, Primary Examiner

JERRY D. CRAIG, Assistant Examiner

U.S. Cl. X.R.

136—203; 307—299

PO-1050
(5/69)

UNITED STATES PATENT OFFICE
CERTIFICATE OF CORRECTION

Patent No. 3,460,008 Dated August 5th, 1969

Inventor(s) Reinhard Dahlberg

It is certified that error appears in the above-identified patent and that said Letters Patent are hereby corrected as shown below:

In the heading of the patent, line 7, change "Dec.27" to --Dec.24--. Column 4, line 40, change "mode" to --made--; line 61, change "af" to --of--.

SIGNED AND
SEALED
APR 28 1970

(SEAL)
Attest:

Edward M. Fletcher, Jr.
Attesting Officer

WILLIAM E. SCHUYLER, JR.
Commissioner of Patents